(12) United States Patent
Shizukuishi

(10) Patent No.: US 7,196,312 B2
(45) Date of Patent: Mar. 27, 2007

(54) NON-VOLATILE SOLID STATE IMAGE PICKUP DEVICE AND ITS DRIVE

(75) Inventor: Makoto Shizukuishi, Miyagi (JP)

(73) Assignee: Fuji Photo Film Co., Ltd., Minami-ashigara (JP)

(*) Notice: Subject to any disclaimer, the term of this patent is extended or adjusted under 35 U.S.C. 154(b) by 272 days.

(21) Appl. No.: 10/660,772

(22) Filed: Sep. 12, 2003

(65) Prior Publication Data

US 2004/0056176 A1    Mar. 25, 2004

(30) Foreign Application Priority Data

Sep. 20, 2002    (JP)    ............... 2002-275334

(51) Int. Cl.
*H01L 31/00* (2006.01)
*H01L 31/062* (2006.01)
*H01L 29/788* (2006.01)

(52) U.S. Cl. ............ 250/214.1; 257/291; 257/315

(58) Field of Classification Search ............ 250/214.1; 257/315, 414, 428, 461, 291
See application file for complete search history.

(56) References Cited

U.S. PATENT DOCUMENTS

| | | | | |
|---|---|---|---|---|
| 5,075,888 A | * | 12/1991 | Yamauchi et al. | 365/185.08 |
| 6,060,742 A | * | 5/2000 | Chi et al. | 257/316 |
| 6,501,109 B1 | * | 12/2002 | Chi | 257/223 |
| 6,784,933 B1 | * | 8/2004 | Nakai | 348/302 |
| 6,816,198 B1 | * | 11/2004 | Suzuki | 348/294 |
| 2001/0054726 A1 | * | 12/2001 | Abe | 257/292 |
| 2002/0171102 A1 | | 11/2002 | Shizukuishi | 257/315 |
| 2004/0214379 A1 | * | 10/2004 | Lee et al. | 438/149 |

FOREIGN PATENT DOCUMENTS

| | | |
|---|---|---|
| JP | 61-048972 | 3/1986 |
| JP | 61-222262 | 10/1986 |
| JP | 08-340100 | 12/1996 |
| JP | 08340100 A * | 12/1996 |
| JP | 2002/280537 | 9/2002 |

* cited by examiner

*Primary Examiner*—Georgia Epps
*Assistant Examiner*—Brian Livedalen
(74) *Attorney, Agent, or Firm*—Arent Fox PLLC

(57) ABSTRACT

A solid state image pickup device has: an n-type semiconductor substrate; a p-type layer formed in the n-type substrate; a first n-type region formed in the p-type layer and constituting a photodiode therewith; a first gate structure including a charge storage region and a control gate, formed on the semiconductor substrate adjacent to the first region; a second n-type region formed adjacent to the first gate structure on opposite side to the first region, constituting a non-volatile memory element with the first region and the first gate structure; and a control circuit for applying write and read voltages to the control gate, for tunneling and writing charges, and for reading stored information. A solid state image pickup device is provided which can execute a novel pixel signal read operation.

29 Claims, 8 Drawing Sheets

NON-VOLATILE SOLID STATE IMAGE PICKUP DEVICE AND ITS DRIVE

CROSS REFERENCE TO RELATED APPLICATION

This application is based on and claims priority of Japanese Patent Application No. 2002-275334 filed on Sep. 20, 2002, the entire contents of which are incorporated herein by reference.

BACKGROUND OF THE INVENTION

A) Field of the Invention

This invention relates generally to a solid state image pickup device and a driving method therefor, and particularly to a solid state image pickup device with a novel pixel structure and a solid state image pickup device drive method with a novel pixel signal reading operation.

B) Description of the Related Art

MOS type, CCD type and CMOS type solid state image pickup devices are known as conventional solid state image pickup devices.

FIG. 6 shows the structure of a conventional MOS type solid state image pickup device.

A number of pixels PX are disposed in a matrix layout on the surface of a semiconductor substrate. Each pixel PX includes one photodiode PD as a photosensitive element and one MOS field effect transistor MOSFET for reading charges accumulated in the photodiode PD. In the arrangement illustrated in FIG. 6, the cathode of the photodiode PD constitutes a charge accumulation region and is connected to the source region of MOSFET. A row select signal line 103 is connected to the gate of MOSFET and the drain of MOSFET is connected to a read signal line 105.

The row select signal lines 103 are connected to a vertical shift register VSR and sequentially receive row select signals. The read signal lines 105 are connected via column select transistors 107 to an output amplifier AMP. The control electrodes of the column select transistors 107 are connected to a horizontal shift register HSR and sequentially receive column select signals. A timing generator 109 supplies a timing signal to the horizontal shift register HSR and vertical shift register VSR. These registers HSR and VSR start their operations upon reception of a V-Start signal and an H-Start signal, respectively.

While a single pixel row is selected by the vertical shift register VSR, the horizontal shift register HSR sequentially selects the respective columns and supplies the charges of one row to the output amplifier AMP.

This arrangement is similar to the arrangement of a DRAM whose memory cell is constituted of one MOSFET and one capacitor. Although this arrangement uses MOSFET, it does not have an amplification function and is thus called also a passive sensor. The structure shown in FIG. 6 has been manufactured normally using n-MOS processes.

If the electrical characteristics of switching MOSFET's have fluctuations, outputs of pixels will have variations even with the same incident light amount so that fixed pattern noises are generated.

An image cannot be picked up with all pixels at the same time so that the image of a moving subject drifts. Charges accumulated in all pixels are hard to be electronically cleared at the same time.

FIG. 7 shows the structure of an interline CCD (IT-CCD) which is used most often among solid state image pickup devices.

The arrangement of IT-CCD having a matrix layout of pixels PX each constituted of a photodiode PD and a MOSFET is similar to that shown in FIG. 6. In place of the read signal line, a vertical charge coupled device VCCD is disposed along a pixel column. One end of VCCD is connected to a horizontal charge coupled device HCCD. The output end of HCCD is connected to a floating diffusion amplifier FDA.

In IT-CCD, signal charges accumulated in the cathode regions of photodiodes PD are transferred through MOSFET's to VCCD's, HCCD, and to FDA along the charge transfer paths only in semiconductor. Each VCCD has a number of transfer stages and can hold charges. Charges can thus be read into VCCD's from a number of pixels simultaneously. VCCD is for example driven by four-phase drive signals $\phi V1$ to $\phi V4$. HCCD is for example driven by two-phase drive signals $\phi H1$ and $\phi H2$ at high speed. Still images without drift can therefore be output.

A light shielding film is disposed above the charge transfer paths of VCCD's and HCCD to prevent light from entering into the charge transfer paths. A highly sensitive solid state image pickup device can be realized which is less affected by noises. Improvement on the image quality is realized by incorporating a complete depletion type photodiode structure. Since charges accumulated in pixels can be moved to VCCD's at the same time via transfer gates, a so-called completely electronic shutter can be realized.

IT-CCD requires a high drive voltage and a high consumption power so that it is difficult to be driven with a single power source. IT-CCD is manufactured by dedicated specific processes different from generalized CMOS processes. Since charges read from photodiodes PD's are output via VCCD's and HCCD, random access of pixels is difficult.

FIG. 8 shows a CMOS type solid state image pickup device. Although the arrangement for just one pixel is shown in FIG. 8, a number of pixels PX are disposed in a matrix layout similar to those pixels shown in FIGS. 6 and 7.

Each pixel PX is constituted of: a photodiode PD; a source follower amplifier SFA for reading and amplifying charges accumulated in the photodiode PD; and a reset transistor RT. The source follower amplifier SFA includes an amplifier transistor 121 whose gate receives a signal voltage and a transfer transistor 123.

The respective current terminals of the transfer transistor 123 and reset transistor RT are connected to a power source line 117. One terminal of the amplifier transistor 121 is connected to a read signal line 113. The gate electrode of the transfer transistor 123 is connected via a row select signal line 111 to a vertical shift register VSR. The gate electrode of the reset transistor RT is connected to a reset signal line 115.

The read signal line 113 is connected via a noise canceler 131 to one terminal of a column select transistor 133. The other terminal of the column select transistor 133 is connected to an output amplifier AMP to output an image signal. The gate electrode of the column select transistor 133 is connected to a horizontal shift register HSR.

With the widespread of portable information terminals, cameras for inputting images to personal computers (PC's), and compact digital still (DS) cameras, attention has been paid to compact solid state image pickup devices of low power consumption. CMOS solid state image pickup devices based on CMOS processes are developed which can be driven by a single power supply and at low power consumption as different from CCD solid state image pickup devices. With the CMOS arrangement, on-chip peripheral circuits can be realized easily and low power consumption can be realized.

These merits promote the improvement on the characteristics of and the practical application of CMOS type solid state image pickup devices. Low noises are realized by providing an amplifier for each pixel of a CMOS solid state image pickup device. This device is called also an active sensor because each pixel has an active (amplifying) element. This device however requires in addition to one photodiode, three or more transistors (MOSFET's) per pixel.

As the number of MOSFET's per pixel increases, the operation margin of the photodiode becomes severe, resulting in a difficulty of realizing high sensitivity and high density of pixels. In a photodiode type CMOS solid state image pickup device, an ohmic contact exists between the read circuit and pixel so that it is difficult to lower the impuirty concentration of the entire charge accumulation region and thus difficult to realize a complete depletion type photodiode. From this reason, fixed pattern noises (FPN) and reset noises are generated when photodiodes are reset to a fixed potential. Fixed pattern noises are generated because of variations in the depletion layer capacitance of the photodiodes. Reset noises are generated by thermal fluctuation of the channel resistances of the reset transistors RT. Since the device is driven by XY sequential addressing, the image of a moving subject drifts. An electronic shutter function or mechanical shutter-less camera is difficult to be realized.

The present inventor proposed a non-volatile solid state image pickup device having a non-volatile memory function in each pixel in a U.S. patent application Ser. No. 10/100,069 based on Japanese Patent Application No. 2001-083374, which is incorporated herein by reference.

As described above, conventional solid state image pickup devices have such merits as well as demerits.

SUMMARY OF THE INVENTION

An object of this invention is to provide a solid state image pickup device based on a novel operation principle.

Another object of this invention is to provide a novel operation method for a solid state image pickup device.

Yet another object of this invention is to provide a solid state image pickup device having a novel configuration capable of obtaining images signal of all pixels taken at the same time.

Yet another object of this invention is to provide a solid state image pickup device suitable for being made compact.

According to one aspect of the present invention, there is provided a solid state image pickup device comprising: a semiconductor substrate having a first layer of a first conductivity type; a second layer of a second conductivity type opposite to the first conductivity type, the second conductivity type layer being formed on the first conductivity type layer of the semiconductor substrate; a first region of the first conductivity type formed in the second conductivity type layer and constituting a photodiode with the second conductivity type layer; a first gate structure including a charge storage region and a control gate, the first gate structure being formed on a surface of the semiconductor substrate adjacent to a portion of the first region; a second region of the first conductivity type formed adjacent to the first gate structure on a side opposite to the first region, and constituting a non-volatile memory element with the first region and the first gate structure; and a control circuit for applying a first write voltage to the control gate of the first gate structure, the first write voltage being a write voltage for tunneling and writing charges accumulated in the first region into the charge storage region.

Another aspect of the invention provides a solid state image pickup device comprising: a semiconductor substrate having a first layer of a first conductivity; a second layer of a second conductivity type opposite to the first conductivity type, the second conductivity type layer being formed on the first conductivity type layer of the semiconductor substrate; a first first conductivity type region formed in the second conductivity type layer and constituting a photodiode with the second conductivity type layer; a first gate structure including a charge storage region and a control gate, the first gate structure being formed on a surface of the semiconductor substrate adjacent to a portion of the first first conductivity type region; a second first conductivity type region formed adjacent to the first gate structure on a side opposite to the first first conductivity type region, and constituting a non-volatile memory element with the first first conductivity type region and the first gate structure; a second gate structure of an insulated gate type formed adjacent to another portion of the first first conductivity type region; and a third first conductivity type region formed adjacent to a side of the second gate structure opposite to the first first conductivity type region, the third first conductivity type region constituting an insulated gate type transistor along with the first first conductivity type region and the second gate structure.

Still another aspect of the invention provides a driving method for a solid state image pickup device, comprising the steps of: (a) applying light to photodiodes distributed in a matrix layout and accumulating charges representative of image information, the photodiodes being formed in a second conductivity type layer formed on a first conductivity type layer of a semiconductor substrate, the first conductivity type being opposite to the second conductivity type; (b) applying a first write control voltage to a control gate of a non-volatile memory element having a charge storage region, a control gate and a drain region, the non-volatile memory element being formed adjacent to each of the photodiodes, and tunneling and injecting at least a portion of the charges representative of the image information into the charge storage region as signal charges; and (c) applying a read control voltage to the non-volatile memory element to detect a threshold voltage corresponding to an amount of the signal charges injected at the step (b) into the charge storage region.

Generated charges are injected into the charge storage region of the memory element. The charge amount (current) is converted into a voltage which can be held temporarily.

Detection and record of a light signal can be performed at the same time on the same semiconductor chip.

Image signals for all pixels taken at the same time can be obtained.

The influence of switching noises during a high speed operation can be mitigated and a low speed read operation with a low power consumption drive is possible.

Low power consumption drive can be realized and an electronic shutter operation is possible. Since a voltage detection type element is used, the dynamic range of an output signal can be broadened and reduction in the signal amount to be caused by miniaturization (scaling) and increase in integration density of pixels in the same chip size can be prevented.

Since a temporarily storage function is provided, peripheral circuits can be simplified and the whole system cost can be reduced.

A well-balanced combination of F-N tunneling injection and hot electron charge injection (write operation) can broaden the dynamic range.

Noise reduction and a broadened dynamic range can suppress so-called "white spots" under high illuminance and the image of a subject can be picked up with high fidelity in the range from a dark area (low illuminance area) to a highlight area (high illuminance area).

DESCRIPTION OF THE PREFERRED EMBODIMENTS

Figure 1A:
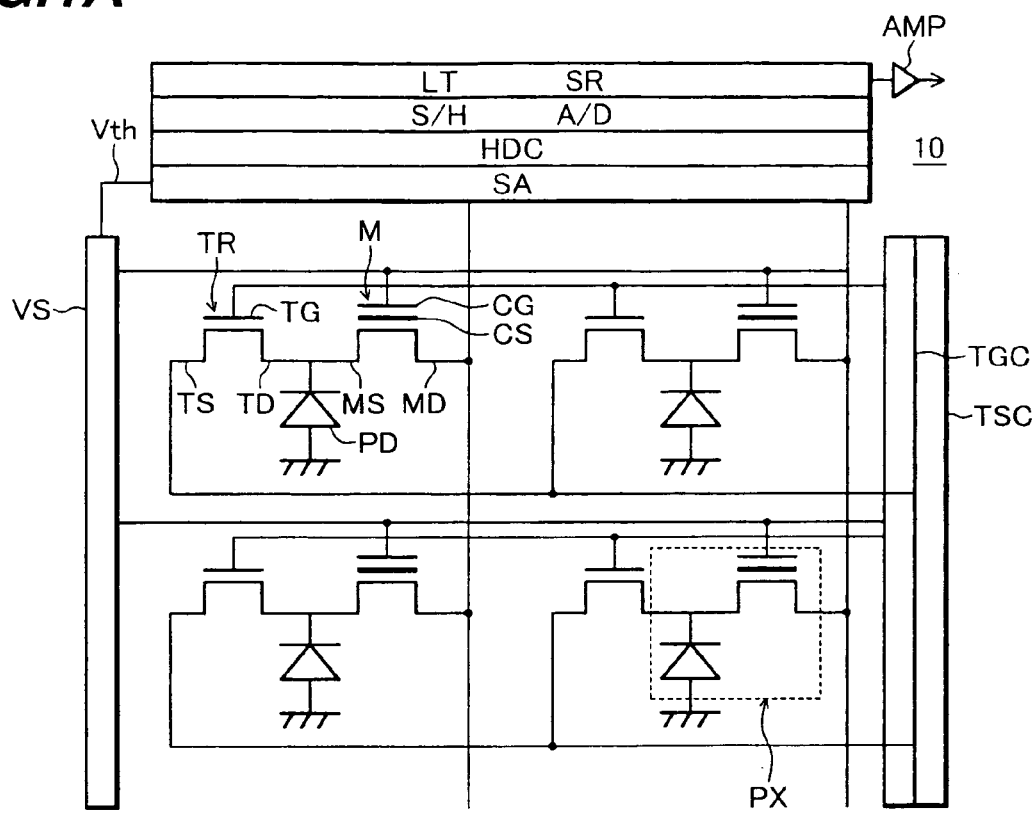
FIG. 1A is a schematic diagram showing the structure of a solid state image pickup device according to a first embodiment of the invention.

FIG. 1A shows the structure of a solid state image pickup device having pixels PX disposed on a semiconductor substrate 10 in a two-dimensional array. Photodiodes PD are disposed in a two-dimensional array and form a photosensitive plane. Each pixel PX has one photodiode PD as a photoelectric conversion element and one non-volatile memory element M. Although only four pixels are shown in FIG. 1A, an actual device has a pixel matrix of several hundreds rows and several hundreds to one thousand and several hundreds columns.

The memory element M is made of a transistor structure having a source MS connected to the photodiode PD, a charge storage region CS, a control gate CG and a drain MD.

An auxiliary transistor TR is used as a current supply source for flowing a channel current through the memory element M during a read operation. The auxiliary transistor TR is made of a MOS transistor structure having a drain TD connected to the source MS of the memory element, a gate TG and a source TS. The gate TG is controlled by a gate controller TGC, and the source TS is controlled by a source controller TSC.

The control gate CG of the memory element M is controlled by a vertical shift register VS. The vertical shift register VS applies predetermined voltages to the control gate CG during read/write operations. During the write operation, a voltage is applied to the control gate to write charges accumulated in the photodiode PD into the charge storage region CS. During the read operation, a voltage, for example, a monotonically increasing voltage like a saw tooth (triangle) wave form, is applied to the control gate to detect a threshold voltage Vth of the memory element M.

During the write operation, the drain MD of the memory element M is controlled by a horizontal (H) drain control circuit HDC. During the read operation, a sense amplifier SA supplies a drain voltage to the drain MD and detects the threshold voltage Vth of the memory element M in accordance with a current value of the drain MD relative to the potential at the control gate CG.

Figure 1B:
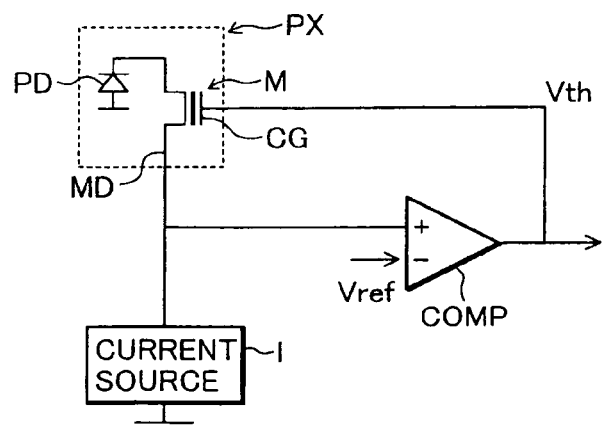
FIG. 1B is an equivalent circuit of a pixel and a threshold value detector circuit.

FIG. 1B is the equivalent circuit of a threshold value detector circuit of the sense amplifier SA. A reference potential Vref is applied to an inverting input terminal of a comparator COMP, and a voltage at the drain MD of the memory element M is applied to a non-inverting input terminal. Current is supplied from a current source I to the memory element M. An output voltage of the comparator COMP is applied to the control gate CG. The control gate CG is controlled by a vertical shift register VS.

The comparator COMP outputs the memory threshold voltage Vth by detecting a channel current of the memory element M while the reference voltage Vref is changed. The voltage at the control gate CG is detected as the threshold voltage Vth when the channel current rises to a predetermined value.

As shown in FIG. 1A, a sample-hold circuit S/H, an AD converter A/D and other circuits are formed on the same semiconductor substrate 10 in order to digitalize the threshold voltage Vth. AD-converted data is recorded in a latch circuit LT, sequentially transferred in the horizontal direction by a horizontal shift register SR, and output via an output amplifier AMP to an external of the device as digital data.

Figure 2A:
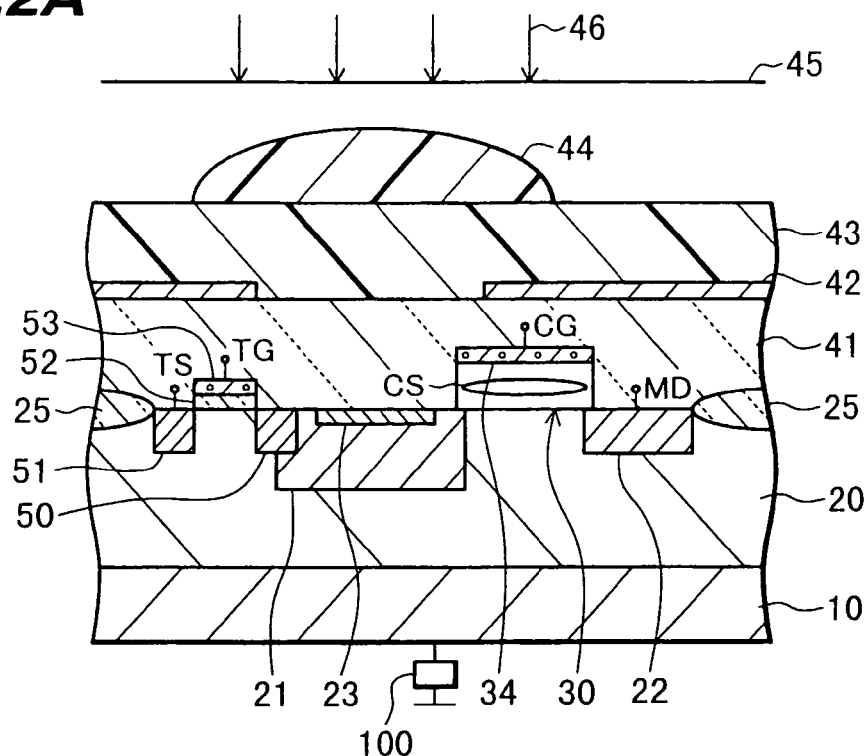
FIG. 2A is a cross sectional view showing the structure of a pixel of the first embodiment.

The pixel structure of the embodiment will be described more in detail. FIG. 2A is a cross sectional view showing one pixel PX shown in FIG. 1A and the auxiliary transistor TR connected to the pixel PX. A p-type well 20 having an impurity concentration of $1\times10^{15}$ cm$^3$ is formed in the surface layer of an n-type silicon substrate 10 having an impurity concentration of $5\times10^{14}$ cm$^3$. In the surface layer of the p-type well 20, an n-type region 21 is formed which has an impurity concentration of $2\times10^{17}$ cm$^3$ and constitutes the photodiode PD. A p-type region 23 having an impurity concentration of $1\times10^{18}$ cm$^3$ is formed covering the surface of the n-type region 21, to make the photodiode have a buried type photodiode structure. A voltage source 100 is connected to the n-type silicon substrate 10.

An n$^+$-region 50 is formed to be connected to the n-type region 21. An n$^+$-region 51 is formed in the p-type well 20 in the area near the n$^+$-type region 50. The n$^+$-type regions 50 and 51 constitute the drain and source regions of the auxiliary transistor, respectively. The p-type well 20 between the n$^+$-type regions 50 and 51 constitutes the channel region of the auxiliary transistor. The n$^+$-type regions 50 and 51 function as a current supply source for supplying a channel current through the channel region of the memory element when the threshold voltage is read.

Formed on the channel region of the auxiliary transistor are a gate insulating film 52 made of silicon oxide and a gate electrode 53 made of polysilicon. The auxiliary transistor TR having the MOS structure is thus formed having the n$^+$-type regions 50 and 51, gate insulating film 52 and gate electrode 53. An isolation region 25 is made of a silicon oxide film formed by local oxidation of silicon (LOCOS), shallow trench isolation (STI) or the like.

An n-type region 22 is formed in an area near the n-type region 21 which functions as the cathode region of the photodiode and also as the source region of the memory element. The n-type region 22 constitutes the drain region of the memory element. The region between the n-type regions 21 and 22 constitutes the channel region of the memory element. A gate structure 30 is formed on the channel region of the memory element.

As a non-volatile memory element, the following types may be used including a metal oxide nitride oxide semiconductor (MONOS) type having a silicon nitride film sandwiched between silicon oxide films, a metal nitride oxide semiconductor (MNOS) type having a lamination of a silicon nitride film and a silicon oxide film, and a floating gate (FG) type having a floating gate made of polysilicon.

Figure 2B:
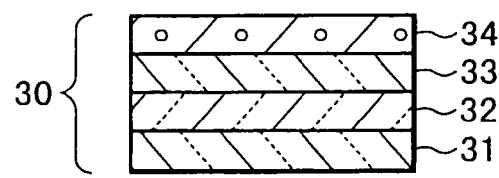
FIGS. 2B to 2D are cross sectional views showing the structures of gate.

FIG. 2B shows the gate structure 30 of the MONOS type. Three layers, a silicon oxide film 31, a silicon nitride film 32 and a silicon oxide film 33, are stacked to form the structure called an ONO film. On the ONO film, a control gate 34 is formed which is made of, for example, polysilicon. Charges can be stored at the interface between the silicon nitride film and silicon oxide film. Charges can be trapped locally.

The silicon oxide film 31 is formed by thermally oxidizing the underlying substrate surface at a substrate temperature of 800 to 900° C. For example, the silicon oxide film 31 is 2 nm thick. The silicon nitride film 32 is formed by low pressure chemical vapor deposition (LPCVD) at a growth temperature of 600 to 800° C. For example, the silicon nitride film is 5 nm thick. The silicon oxide film 33 is formed by thermally oxidizing the underlying nitride film at a temperature of 800 to 900° C. For example, the silicon oxide film 33 is 4 nm thick.

Figure 2C:
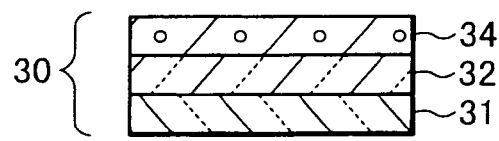

As shown in FIG. 2C, the MONOS type structure is formed by omitting the silicon oxide film 33 shown in FIG. 2B.

Figure 2D:
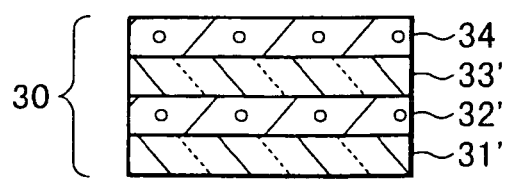

FIG. 2D shows the gate structure 30 of an FG memory. A lamination structure is formed which has a silicon oxide film 31', a floating gate 32' made of polysilicon and a silicon oxide film 33'. On this lamination structure, a control gate 34 is formed which is made of, for example, polysilicon. Since the floating gate 32' in which charges are stored is electrically conductive, injected charges broadly distribute in the floating gate 32'.

The memory element of the MONOS type is constituted of the n-type regions 21 and 22, silicon oxide films 31 and 33, silicon nitride film 32 and gate electrode 34. If the silicon oxide film 33 of the MONOS type is omitted, the MNOS type structure is formed. The memory element of the FG type is constituted of the n-type regions 21 and 22, silicon oxide films 31' and 33', floating gate 32' and gate electrode 34. Any one of the MONOS, MNOS and FG types may be used as a non-volatile memory element.

Formed on the gate electrode 34 is an insulating layer 41 made of resin, silicon oxide or the like and having a planarized surface. Formed on the insulating layer 41 is a light shielding film 42 made of metal such as W or the like. The light shielding film 42 has an opening above the n-type region 21 of each photodiode to allow light to pass through the opening. The light shielding film 42 covers the area other than each photodiode, such as areas above the transistor structures and wiring structures, thereby shielding incident light. A color filter 43 is formed covering the light shielding film. A micro lens 44 is formed on the color filter 43. A mechanical shutter 45 is formed above pixels.

As the mechanical shutter 45 is opened, incident light 46 enters the micro lens 44 and is converged. After the incident light 46 passes through the color filter 43, it enters the photodiode 21 via the opening of the light shielding film 42.

The shape and impurity concentration of the n-type region 21 are set so that the whole n-type region is depleted in a light reception state. Therefore, electrons generated by light incidence become dominant in the n-type region 21. By using the completely depleted type photodiode, fixed pattern noises can be reduced. Since the photodiode has the buried photodiode structure formed with the p-type region 23 on the surface side of the photodiode, the spectral sensitivity can be improved and dark current and white defects can be reduced.

As light becomes incident upon the light reception region, accumulation of electrons in the n-type region 21 starts. At a predetermined timing after the mechanical shutter 45 is opened, charges in the photodiode are once drained and reset. This timing is used as an exposure start time. By electronically deciding the exposure start time, high precision control becomes possible.

A through-substrate-drainage shutter operation is used for resetting the photodiode. In FIG. 2, the n-type region 21, p-type well 20 and n-type substrate 10 constitute a vertical bipolar junction transistor structure. By applying a positive potential to the collector (n-type substrate) from the voltage source 100, the potential barrier of the base can be extinguished. Namely, the transistor turns on and charges in the emitter flow to the collector so that the photodiode can be reset.

An exposure time is the time until the mechanical shutter 45 is closed after the reset of the photodiode. At least a portion of charges accumulated in the photodiode 21 during the exposure time is injected into the charge storage region of the memory element.

In some conventional non-volatile memory structures, electrons are injected into the charge storage region made in an ONO film structure by using channel hot electrons (CHE). A CHE injection efficiency is low, 1% or smaller, so that most of electrons flow to the outside of the memory element and are not injected into the charge storage region. If this low injection efficiency is compensated by flowing a large current, there is the advantage that a write (charge injection) process can be completed in a short time.

In some memory structures, charge injection is performed by Fowler-Nordheim (F-N) tunneling. Charge injection by F-N tunneling reduces the amount of lost charges considerably. As compared to hot electrons, quite a long write time is required.

A solid state image pickup device does not require a high write speed like a digital memory. It is sufficient if the charge injection (write) process is completed in the time determined by the shutter speed. For example, if the shutter speed is 1/100 sec, it is sufficient if the write process is completed in 10 msec.

In this embodiment, the charge injection is performed by involving a well-balanced combination of F-N tunneling and channel hot electrons.

When the exposure starts, a positive voltage is applied only to the control gate 34 and the drain 22 is not applied with voltage. The channel region is inverted to the n-type. Charges accumulated in the photodiode are collected in the channel region and injected into the charge storage region of the memory element by F-N tunneling current. Since charges are suppressed from being flowed out as the drain current, the injection efficiency can be raised.

In the last stage of the charge injection process, a positive voltage is applied also to the drain 22 in addition to the control gate 34 to thus add hot electron injection. It is sufficient that a voltage application time to the drain is short (e.g., 10 psec). Electrons remaining in the source region 21 are pulled out to the channel region and accelerated to become hot electrons. A portion of hot electrons is injected into the charge storage region of the memory element. This channel current makes charges left in the photodiode be drained externally via the drain 22 of the memory element. Hot electron injection can broaden the dynamic range of image pickup. The effects of the broadened dynamic range can be understood, for example, in the following manner.

If the incident light amount is small (low illuminance), there is a small amount of charges accumulated in the photodiode. It is therefore expected that the charges can be injected into the memory element by using only an F-N tunneling current which flows as the exposure starts.

If the incident light amount is large (high illuminance), there is a large amount of charges accumulated in the photodiode. Charges not injected by using only an F-N tunneling current are resident in the photodiode. By applying a voltage to the drain in addition to the control gate in the last stage of the charge injection process, the resident charges are pulled out as the channel current and becomes hot electrons a portion of which is injected into the memory element. It is expected that the contribution of hot electron injection becomes greater as the illuminance becomes higher. As described earlier, the efficiency of F-N tunneling injection is high and the efficiency of hot electron injection is low. In terms of an image pickup sensitivity, this can be said that F-N tunneling injection has a relatively "high sensitivity" and the hot electron injection has a relatively "low sensitivity".

In low illuminance, the contribution of high efficiency F-N tunneling injection is large so that the image of a subject can be picked up at a good sensitivity. In high illuminance, the contribution of hot electron injection of "low sensitivity" becomes large so that the image of an object can be picked up in a dynamic range broadened on the high illumination side. The image of an object can be picked up with high fidelity in the range from a dark area (low illuminance area) to a highlight area (high illuminance area).

The source region of the memory element is used as the photodiode so that it has an impurity concentration distribution different from that of the source region of a general non-volatile memory element and that the junction depth is deep. The n-type impurity concentration is lower than that of the drain region. This lower impurity concentration is set in order to improve the sensitivity balance of visual light, and as a MOS transistor, provides the structure easily allowing the short channel effect and hot electron injection.

The amount of signal charges stored in the memory element is read as a change in the threshold voltage Vth. In reading the charge amount, it is necessary to flow current through the memory element. However, all charges in the source region 21 were drained until the end of the write operation.

In order to supply charges to the source region 21, a positive gate voltage is applied to the gate electrode 53 of the auxiliary transistor to turn it on and couple the $n^+$-type regions 50 and 51 and the source region 21 of the memory element. The channel current during the read operation can thus be increased and the read speed can be made high.

At the same time when the auxiliary transistor is turned on, read voltages are applied to the control gate 34 and drain 22 of the memory element. The control gate voltage is gradually raised. The control gate voltage when the drain current starts flowing is the threshold voltage of the cell. This threshold voltage Vth is read as an output signal.

In the state that a voltage necessary for optical write is not applied to the control gate 34, "optical write", i.e., charge injection into the charge storage region of the memory element, is inhibited even if light is applied. Since "optically written" information (signal charges) remain in the charge storage region of the memory element, the charge storage state (non-volatile state) is maintained even if the voltages at the control gate 34 and drain 22 are removed. A signal read operation at arbitrary or low speed is therefore possible. Low speed read and low power consumption can thus be realized without switching noises as in a conventional high speed operation.

Prior to the next image pickup (optical write), signal charges left in memory cells corresponding to the preceding image are removed. Generally, predetermined voltages are applied to the source, drain and substrate (well) of a non-volatile memory cells or a predetermined voltage is applied to a separate erase dedicated gate, to drain charges by using an F-N tunneling current and erase data.

In this embodiment, there are several data erase methods. Among these methods, a method will be described by way of example, in which voltages are applied to the control gate CG and substrate (or p-type well) to drain charges to the substrate. A negative voltage is applied to the control gate and a positive voltage is applied to the substrate (p-type well). Charges in the charge storage region of the memory element are thus drained to the substrate (p-type well).

As different from a conventional non-volatile memory, data is not required to be maintained for a long time. It is more suitable for high speed drive of a solid state image pickup device that charges in the charge storage region of the memory element are drained (erased) after a signal (change in the threshold value Vth) is read for the preparation of the next light signal detection (image pickup). With this arrangement, consecutive or high speed image pickup is possible.

During the image pickup, all photodiodes can be reset at the same time and a write voltage can be applied to the control gates CG (in some case, also to drains MD) of all memory elements to inject charges. Image signals at the same timing can thus be obtained from all pixels.

The read threshold voltage Vth corresponds to a signal charge amount and takes an analog value. The Vth detector circuit is formed along the ends of columns of pixels disposed in the two-dimensional plane. The threshold value Vth is compared with the changing reference voltage Vref. An output of the comparator is quantized into N bits (N is an integer of 2 or larger) according to the required detection precision. The quantized data is output to the horizontal shift register. Digital signals can be obtained directly from the solid state image pickup device.

In the embodiment described above, charges for the channel current flowing during the memory read are supplied from the auxiliary transistor connected to the pixel. In second and third embodiments to follow, the structures not using the auxiliary transistor will be described.

Figure 3A:
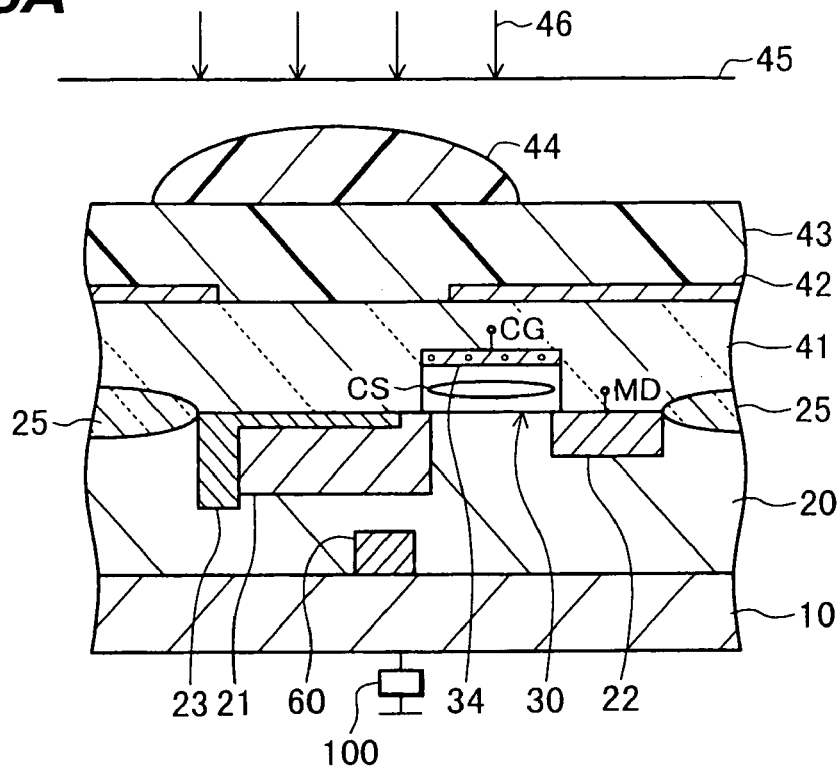
FIG. 3A is a cross sectional view showing the structure of a pixel according to a second embodiment.

FIG. 3A is a cross sectional view of one pixel according to the second embodiment of the invention. The structure (not shown) of the solid state image pickup device is the same as the structure shown in FIG. 1A from which the auxiliary transistor TR, gate controller TGC and source controller TSC are removed.

Referring to FIG. 3A, a p-type region 23 extends surrounding the n-type region 21 to form a channel stop region. In the p-type well 20 under the n-type region 21 near the channel region, an $n^+$-type region 60 is formed projecting from the n-type silicon substrate 10. The $n^+$-type region 60 functions as a current supply source for supplying charges for a channel current during the memory read operation.

Similar to the first embodiment, the through-substrate-drainage shutter function is used for draining charges accumulated in the photodiode before the start of the exposure time. After the exposure, charges accumulated in the photodiode are injected into the charge storage region of the memory element similar to the first embodiment. Charges in the source region 21 have been drained at the end of the injection process.

In reading the memory element, a negative voltage is applied to the n-type silicon substrate 10. A forward bias is applied between the n-type substrate 10 and p-type well. Charges are supplied from the $n^+$-type region 60 to the source 21 of the memory element. To this end, it is preferable to set the n-type impurity concentration of the $n^+$-type region 60 higher and set the distance to the source 21 shorter. The channel current during the read operation can thus be increased and the read speed can be raised.

At the same time when the negative voltage is applied to the n-type silicon substrate 10, read voltages are applied to the control gate 34 and drain 22. As an output signal the control gate voltage (threshold voltage) Vth is read when the drain current starts flowing.

Figure 3B:
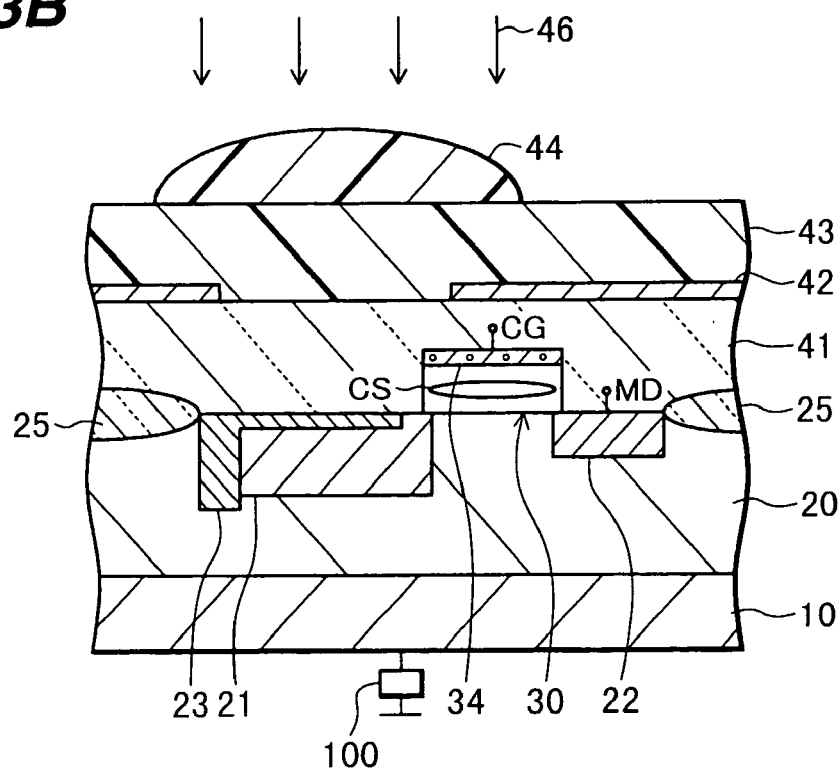
FIG. 3B is a cross sectional view showing the structure of a pixel according to a third embodiment.

FIG. 3B is a cross sectional view of one pixel according to the third embodiment of the invention. In the third embodiment, the $n^+$-type region 60 of the second embodiment shown in FIG. 3A is omitted and the mechanical shutter is also omitted. The structure (not shown) of the solid state image pickup device is the same as the structure shown in FIG. 1A from which the auxiliary transistor TR, gate controller TGC and source controller TSC are removed.

Since the mechanical shutter is not used, external light is incident upon the light reception area even in the standby state. It is therefore necessary to drain unnecessary charges in the photodiode immediately before an optical signal is detected. Similar to the first and second embodiments, the through-substrate-drainage shutter function is used for resetting the photodiode.

At the same time when the photodiode is reset by the through-substrate-drainage shutter function, a predetermined positive voltage is applied to the control gate 34 so that charges generated in the photodiode are injected into the charge storage region of the memory element by using an F-N tunneling current. At the last stage of the injection process, a voltage is applied also to the drain 22 to inject hot electrons.

After the lapse of a predetermined time, application of the positive voltage (write voltage) to the control gate 34 and drain 22 is stopped. The exposure time is the time from resetting the photodiode to the end of the write operation. The end of the exposure (image pickup) time corresponds to the end of the write operation because there is no mechanical shutter and external light enters always.

In reading the memory, in the state that a predetermined positive voltage is applied to the drain 22, a gradually rising positive voltage is applied to the control gate 34. As an output signal, the control gate voltage (threshold voltage) Vth is read when the drain current starts flowing.

Light is incident upon the photodiode (source region of the memory element) even after the exposure time, so that carriers are being generated. These carriers are supplied as the channel current during the read operation.

In the third embodiment, the mechanical shutter 45 may be used. The exposure time is the time from resetting the photodiode to closing the mechanical shutter. Similar to the first and second embodiments, charges are injected into the memory element. Charges spontaneously flowing into the source 21 are used for the channel current during the read operation.

Next, with reference to FIGS. 4A to 4C, description will be given on the operation sequences (timings of charge write, read and erase operations) of the solid state image pickup devices according to the first to third embodiments.

Figure 4A:
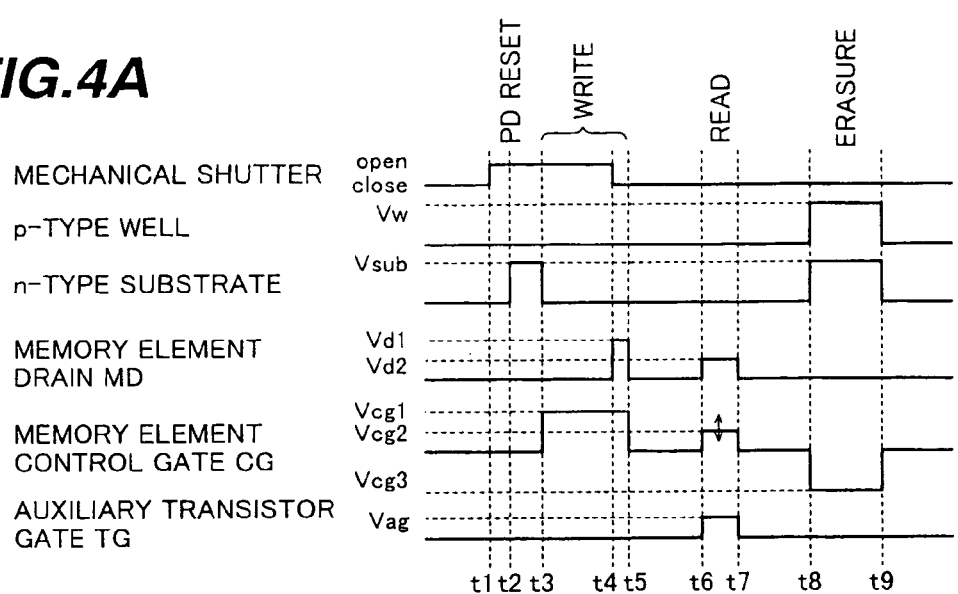
FIGS. 4A, 4B and 4C are timing charts of signals for controlling the operation of a solid state image pickup device.

FIG. 4A is a timing chart illustrating the operation sequence of the first embodiment. At time t1 the mechanical shutter is opened to receive external light. At time t2 a positive voltage Vsub is applied to the n-type substrate to drain unnecessary charges accumulated in photodiodes to the substrate and reset the photodiodes.

After the charge drainage, at time t3 the high write voltage Vcg1 is applied to the control gate CG to start the write operation utilizing F-N tunneling. Instead of performing the write operation throughout the total exposure time, during the initial period of the exposure time only the charge storage operation may be performed and the high write voltage is applied at an intermediate timing in the exposure period.

At time t4, the mechanical shutter is closed to terminate the exposure. The time (t4–t3) corresponds to the exposure time or shutter speed. Charges generated by incident light during the period from time t3 to t4 are thus injected into the charge storage region of the memory element.

The write voltage continues to be applied to the control gate CG until time t5. During the period from time t4 to t5, the positive voltage Vd1 is applied also to the drain MD. Channel current therefore flows so that charges left in the source region of the memory element are pulled out.

After a light signal is stored (written) in the memory element, the read operation starts for the light signal at time t6. At time t6, a monotonically increasing voltage Vcg2 is applied to the control gate CG to detect a drain current change with the voltage applied to the control gate CG. Also at time t6 a positive voltage Vag is applied to the gate of the auxiliary transistor TR to turn it on and supply charges for the channel current (drain current).

After the read operation is completed at time t7, charges left in the charge storage region of the memory element are erased for the preparation of the next image pickup.

During the period from time t8 to t9, the charges in the charge storage region of the memory element are drained to the substrate (or p-type well) side by applying erase voltages –Vcg3 and Vsub (or Vw) to the control gate CG and n-type substrate (or p-type well), respectively.

Figure 4B:
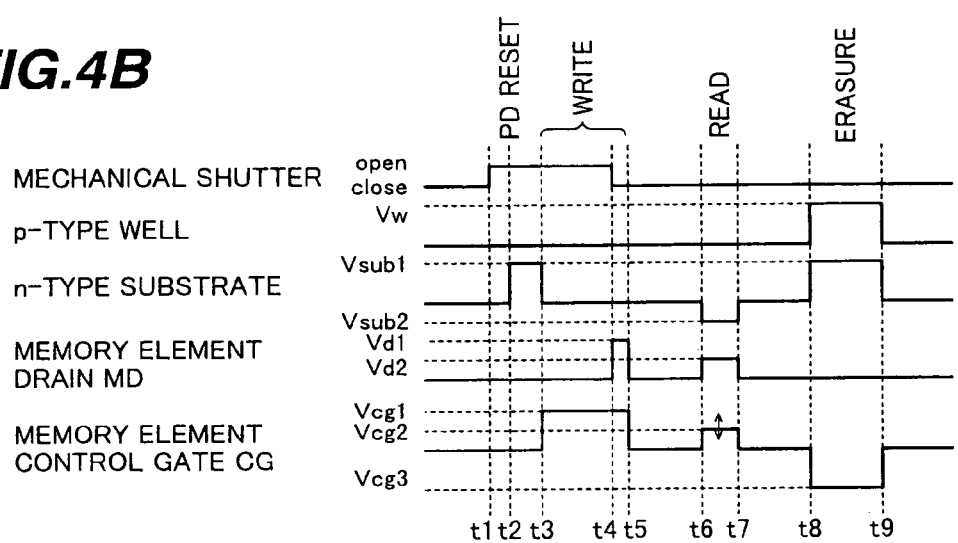

FIG. 4B is a timing chart illustrating the operation sequence of the second embodiment. The operation timings of the mechanical shutter, the drain and control gate of the memory element are similar to those of the first embodiment.

After the mechanical shutter is opened at time t1, a positive voltage Vsub1 is applied to the n-type substrate 10 at time t2 to reset the photodiode PD by the through-substrate-drainage shutter function.

After the exposure and charge injection into the memory element M similar to the first embodiment, the read operation starts at time t6. The operations of the drain MD and control gate CG are similar to those of the first embodiment.

Also at time t6, a negative voltage –Vsub2 is applied to the n-type substrate 10. A forward bias is therefore applied between the n-type substrate 10 and p-type well. Charges are supplied to the source region S (photodiode PD) of the memory element M from the $n^+$-type region 60 formed under the source region S to thus flow the channel current. The memory erase operation is similar to that of the first embodiment.

Figure 4C:
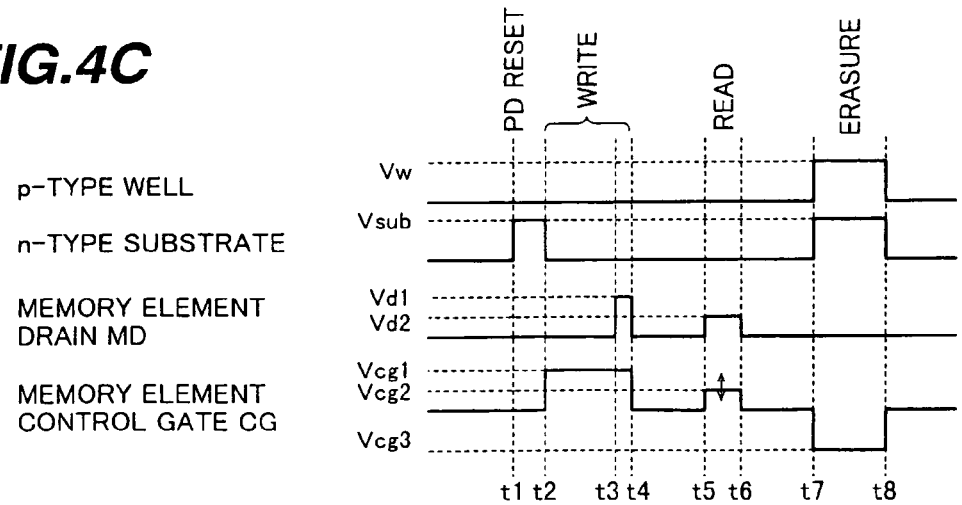

FIG. 4C is a timing chart illustrating the operation sequence of the third embodiment. Since the mechanical shutter is not used, there is no operation specific to the mechanical shutter.

At time t1 a positive voltage Vsub is applied to the n-type substrate to reset photodiodes. After the charge drainage, the high write voltage Vcg1 is applied to the control gate CG during the period from time t2 to t4. During the period from time t3 to t4, the positive voltage Vd1 is applied also to the drain MD.

During the period from t2 to t4, charges generated by incident light are injected into the charge storage region of the memory element. The time (t4–t2) corresponds to the exposure time or shutter speed. Instead of performing the write operation during the total exposure time, during the initial period of the exposure time only the charge storage operation may be performed and the high write voltage is applied at an intermediate timing in the exposure period.

After a light signal is stored (written) in the memory element, the read operation starts for the light signal at time t5. At time t5, a positive voltage Vd2 is applied to the drain MD and a monotonically increasing voltage Vcg2 is applied to the control gate CG to detect a drain current change with the voltage applied to the control gate CG.

Since external light is not shielded by a mechanical shutter, carriers are always generated in the light reception area. The third embodiment is therefore unnecessary to perform the charge supply process of supplying charges to the source region of the memory element during the read operation of the first and second embodiment.

After the read operation is completed at time t6, the memory erase operation similar to the first and second embodiment is performed at time t7 for the preparation of the next image pickup.

In the timing charts of FIGS. 4A to 4C, the voltages indicated by the same symbol may take different values. The timing charts of FIGS. 4A to 4C represent different embodiments.

Next, by referring to FIG. 5, description will be made on the signal conversion characteristics of a solid state image pickup device.

Figure 5:
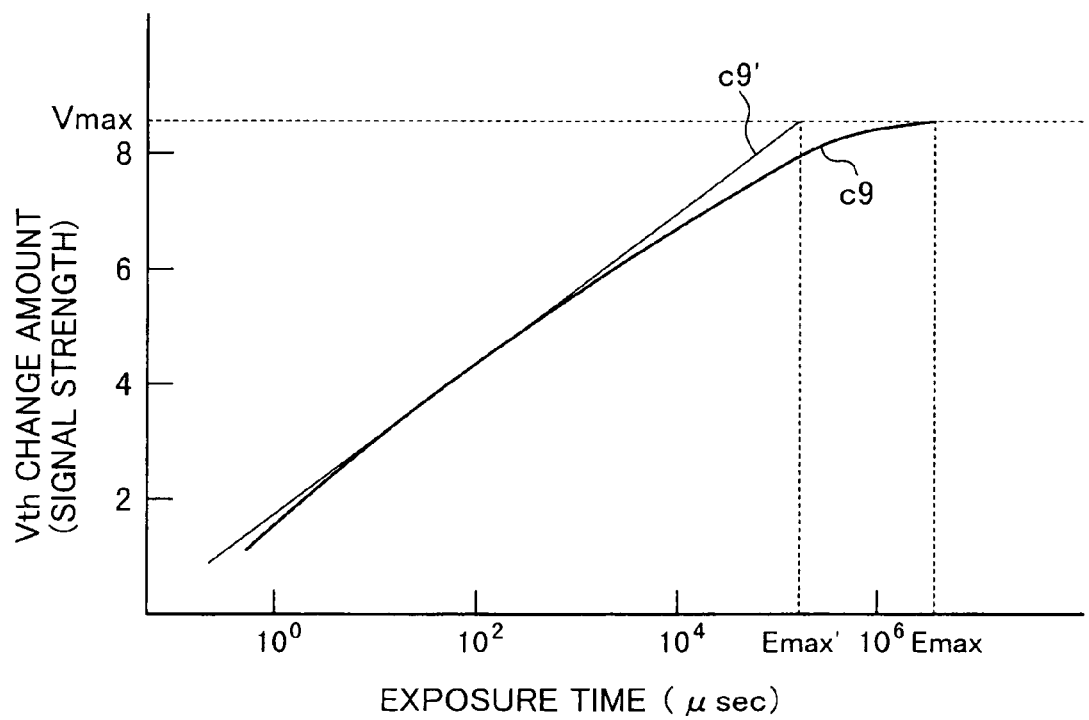
FIG. 5 is a graph showing the signal conversion characteristics of a solid state image pickup device.
Figure 6:
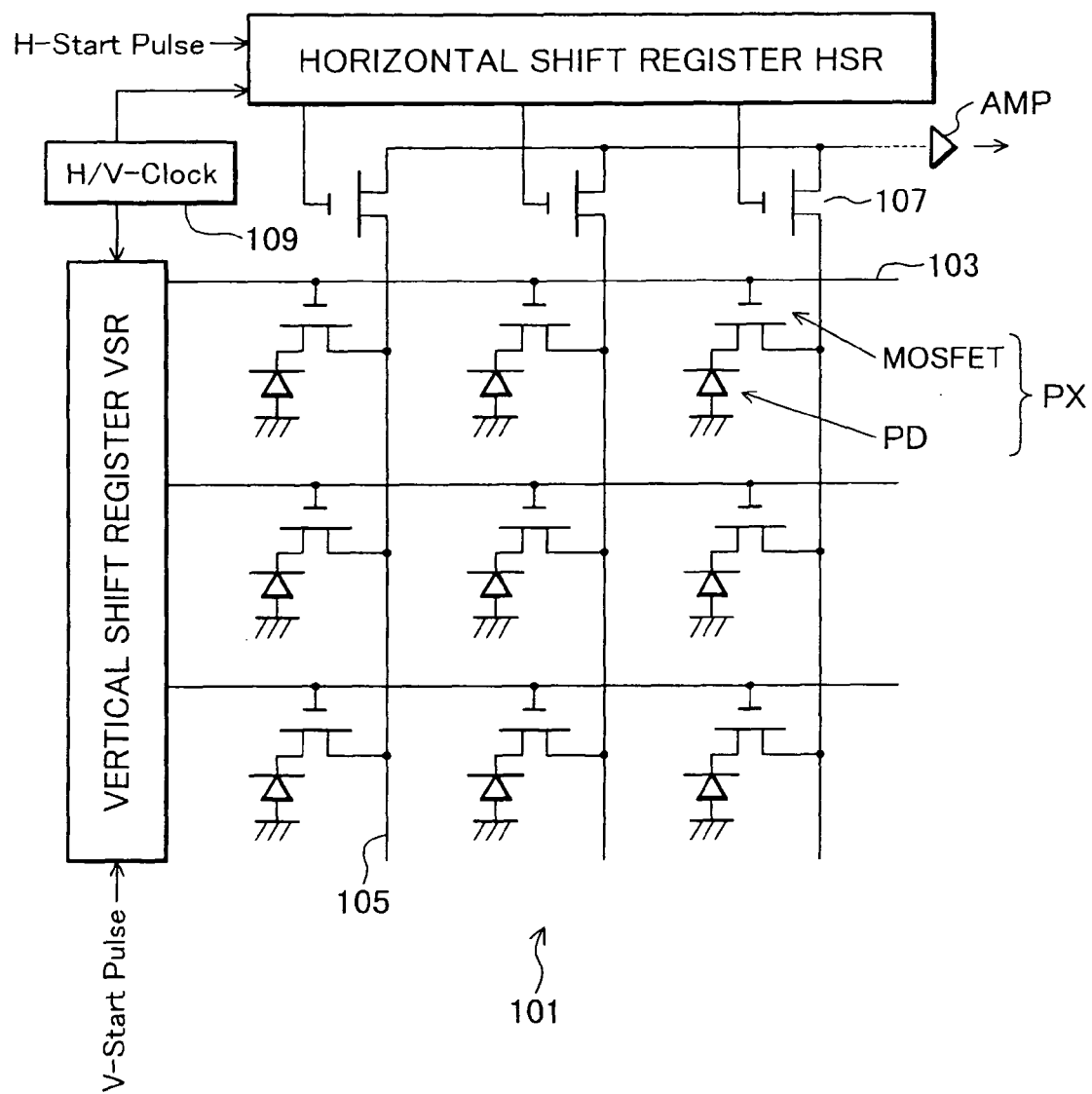
FIG. 6 is a schematic diagram showing the structure of a conventional MOS type solid state image pickup device.
Figure 7:
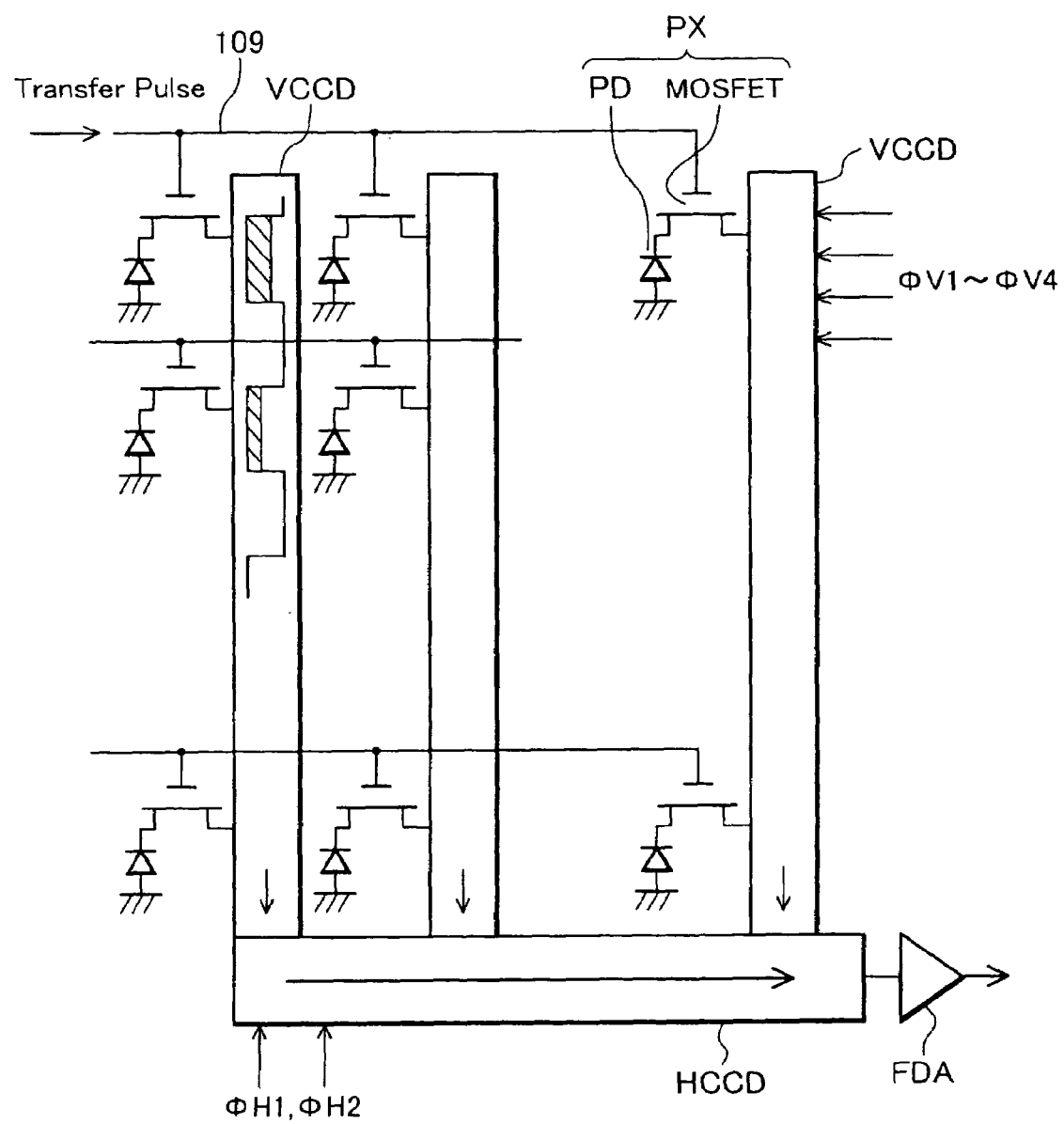
FIG. 7 is a schematic diagram showing the structure of a conventional IT-CCD type solid state image pickup device.
Figure 8:
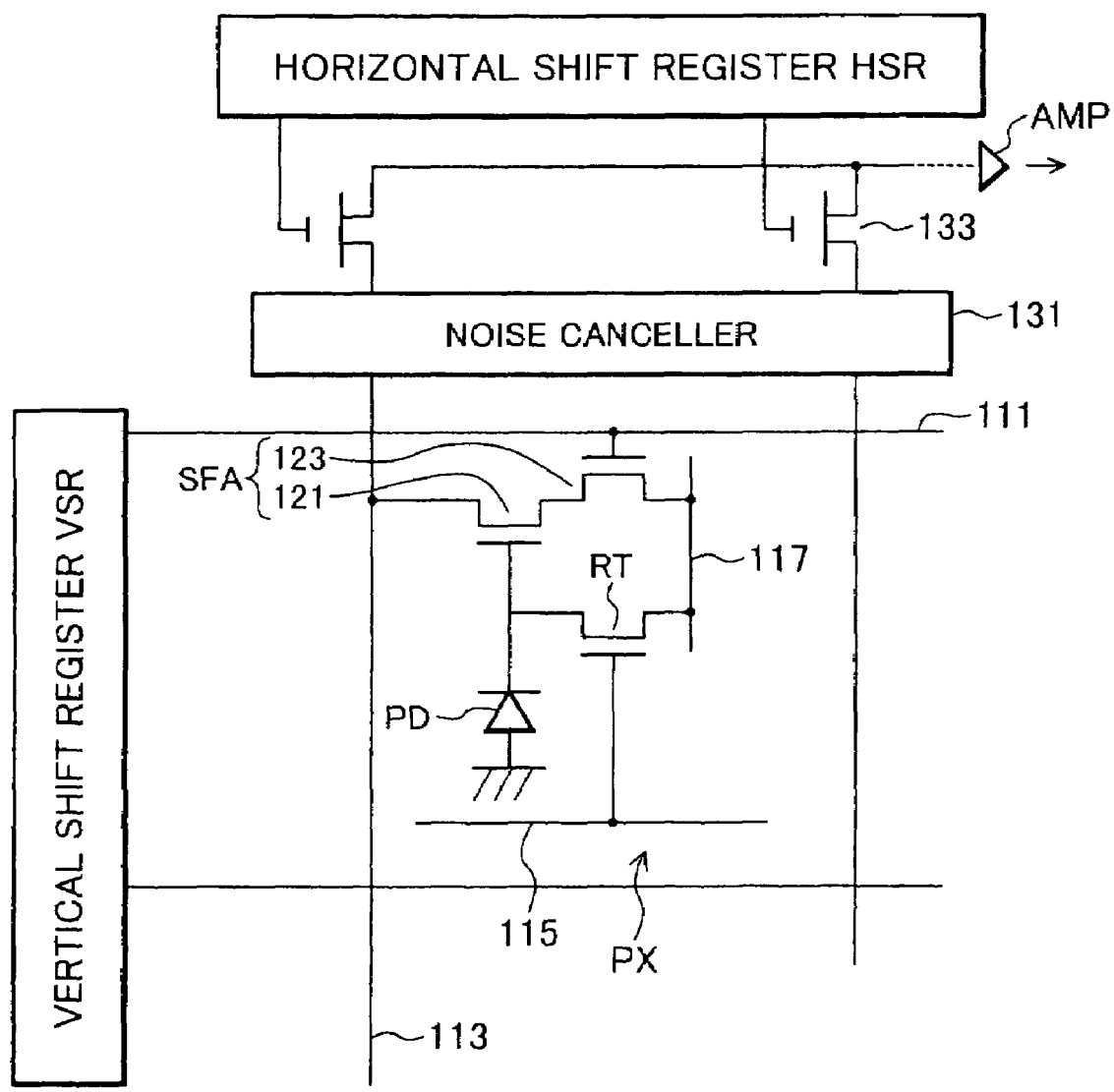
FIG. 8 is a schematic diagram showing the structure of a conventional CMOS type solid state image pickup device.

The abscissa of the graph shown in FIG. 5 represents an exposure time in a log scale corresponding to an exposure energy. The ordinate represents a change amount of the threshold voltage Vth during the read operation (a change amount of Vth relative to Vth when charges are not injected into the memory element).

The characteristic curve c9 was obtained by applying a control gate CG voltage of 9 volt during the write operation. The exposure amount can be determined from the threshold voltage Vth by using this characteristic curve c9.

In the region where the change amount of the threshold voltage Vth is small, a change in Vth relative to the exposure time is approximately linear. As the change amount in the threshold voltage Vth increases, the characteristic curve changes from a linear curve to a saturated curve.

A straight line c9' is fitted to the linear portion of the characteristic curve c9. The relation between the exposure time and the change amount of the threshold voltage can be represented by the straight line c9' assuming that this relation changes linearly up to the region where Vth is high, when the write gate voltage is 9 volt.

Since there is an upper limit of the amount of charges capable of being stored in the memory, there is an upper limit Vmax of the change amount of the threshold voltage Vth during the read operation. After the exposure time (exposure amount) reaches Emax under the characteristic curve c9 or after the exposure time (exposure amount) reaches Emax' under the straight line c9', the threshold voltage does not change with further exposure. Namely, the exposure amounts Emax' and Emax are the upper limits of the dynamic ranges under the straight line c9' and the characteristic curve c9.

The upper limit Emax of the dynamic range under the characteristic curve c9 is larger than the upper limit Emax' under the straight line c9'. It can be said in other words that the dynamic range is broadened if the characteristic curve saturates as the exposure time prolongs.

Electrons injected into the charge storage region of the memory element are considered to be subjected to Coulomb repulsion force of already injected electrons. As the exposure time (exposure amount) prolongs, the number of electrons stored in the memory element increases and the Coulomb repulsion force applied to newly injected electrons becomes possibly strong. Further charge injection is therefore considered to be difficult. It can be presumed that the characteristic curve has the saturated shape shown in FIG. 5 because raising the threshold voltage Vth (charge injection amount) is suppressed for a prolonged exposure time.

The present invention has been described in connection with the preferred embodiments. The invention is not limited only to the above embodiments. It will be apparent to those skilled in the art that various modifications, improvements, combinations, and the like can be made.

I claim:

1. A solid state image pickup device comprising:
   a semiconductor substrate having a first layer of a first conductivity type;
   a second layer of a second conductivity type opposite to the first conductivity type, said second layer being formed on the first layer, in said semiconductor substrate;
   a first region of the first conductivity type formed in said second layer and constituting a photodiode with said second layer, the first region being electrically floating and capable of storing charge carriers;
   a first gate structure including a charge storage region and a control gate, said first gate structure being formed on a surface of said semiconductor substrate adjacent to a portion of said first region, and said charge storage region being isolated from said first region;
   a second region of the first conductivity type formed in said second layer adjacent to said first gate structure on a side opposite to said first region, and constituting a non-volatile memory element with said first region and said first gate structure;
   a first wiring connected to said second region for applying a voltage to said second region;
   a light shielding film formed above said first gate structure and having an aperture above said first region; and
   a control circuit for applying a first write voltage to the control gate of said first gate structure, the first write voltage being a write voltage for tunneling and injecting charges accumulated in said first region into the charge storage region,
   wherein said control circuit applies a second write voltage to the control gate of said first gate structure and to the second region after the first write voltage is applied, the second write voltage being a write voltage for injecting charges accumulated in said first region into the charge storage region as hot carrier injection.

2. A solid state image pickup device comprising:
   a semiconductor substrate having a first layer of a first conductivity type;

a second layer of a second conductivity type opposite to the first conductivity type, said second layer being formed on the first layer, in said semiconductor substrate;

a first region of the first conductivity type formed in said second layer and constituting a photodiode with said second layer, the first region being electrically floating and capable of storing charge carriers;

a first gate structure including a charge storage region and a control gate, said first gate structure being formed on a surface of said semiconductor substrate adjacent to a portion of said first region, and said charge storage region being isolated from said first region;

a second gate structured of an insulated gate type formed adjacent to another portion of said first region;

a second region of the first conductivity type formed in said second layer adjacent to said first gate structure on a side opposite to said first region, and constituting a non-volatile memory element with said first region and said first gate structure;

a third region of the first conductivity type formed adjacent to a side of said second gate structure opposite to said first region, said third region constituting an insulated gate type transistor with said first region and said second gate structure;

a first wiring connected to said second region for applying a voltage to said second region;

a light shielding film formed above said first gate structure and having an aperture above said first region; and a control circuit for applying a first write voltage to the control gate of said first gate structure, the first write voltage being a write voltage for tunneling and injecting charges accumulated in said first region into the charge storage region.

3. A solid state image pickup device comprising:

a semiconductor substrate having a first layer of a first conductivity type;

a second layer of a second conductivity type opposite to the first conductivity type, said second layer being formed on the first layer, in said semiconductor substrate;

a first region of the first conductivity type formed in said second layer and constituting a photodiode with said second layer, the first region being electrically floating and capable of storing charge carriers;

a first gate structure including a charge storage region and a control gate, said first gate structure being formed on a surface of said semiconductor substrate adjacent to a portion of said first region, and said charge storage region being isolated from said first region;

a second region of the first conductivity type formed in said second layer adjacent to said first gate structure on a side opposite to said first region, and constituting a non-volatile memory element with said first region and said first gate structure;

a first wiring connected to said second region for applying a voltage to said second region;

a light shielding film formed above said first gate structure and having an aperture above said first region;

a control circuit for applying a first write voltage to the control gate of said first gate structure, the first write voltage being a write voltage for tunneling and injecting charges accumulated in said first region into the charge storage region; and a fourth region of the first conductivity type projecting from an upper surface of said first layer into said second layer.

4. The solid state image pickup device according to claim 1, wherein the charge storage region of the non-volatile memory element has a floating gate.

5. The solid state image pickup device according to claim 1, wherein the charge storage region of the non-volatile memory element has an interface between a silicon nitride film and a silicon oxide film.

6. A solid state image pickup device comprising:

a semiconductor substrate having a first layer of a first conductivity type;

a second layer of a second conductivity type opposite to the first conductivity type, said second layer being formed on the first layer, in said semiconductor substrate;

a first region of the first conductivity type formed in said second layer and constituting a photodiode with said second layer, the first region being electrically floating;

a first gate structure including a charge storage region and a control gate, said first gate structure being formed on a surface of said semiconductor substrate adjacent to a portion of said first region, and said charge storage region being isolated from said first region;

a second region of the first conductivity type constituting a non-volatile memory element with said first region and said first gate structure, formed in the second layer adjacent to said first gate structure on a side opposite to said first region, a first wiring connected to said second region for applying a voltage to said second region;

a light shielding film formed above said first gate structure and having an aperture above said first region;

a second gate structure of an insulated gate type formed on the surface of said semiconductor substrate, adjacent to another portion of said first region; and a third region of the first conductivity type formed in the second layer, adjacent to said second gate structure on a side opposite to said first region, said third region constituting an insulated gate type transistor with said first region and said second gate structure.

7. The solid state image pickup device according to claim 6, further comprising a control circuit for applying a bias voltage to said second gate structure to turn on the insulated gate type transistor and supplying current to the non-volatile memory element.

8. The solid state image pickup device according to claim 6, wherein the charge storage region of the non-volatile memory element has a floating gate.

9. The solid state image pickup device according to claim 6, wherein the charge storage region of the non-volatile memory element has an interface between a silicon nitride film and a silicon oxide film.

10. A solid state image pickup device comprising:

a semiconductor substrate having a first layer of a first conductivity type;

a second layer of a second conductivity type opposite to the first conductivity type, said second layer being formed on the first layer, in said semiconductor substrate;

a first region of the first conductivity type formed in said second layer and constituting a photodiode with said second layer, the first region being electrically floating;

a first gate structure including a charge storage region and a control gate, said first gate structure being formed on a surface of said semiconductor substrate adjacent to a portion of said first region, and said charge storage region being electrically isolated from said first region;

a second region of the first conductivity type formed in the second layer, adjacent to said first gate structure on a side opposite to said first region, and constituting a non-volatile memory element with said first region and said first gate structure;

a first wiring connected to said second region for applying a voltage to said second region;

a light shielding film formed above said first gate structure and having an aperture above said first region; and a control circuit for applying a forward bias voltage to the first layer of said semiconductor substrate to supply current to the nonvolatile memory element.

11. The solid state image pickup device according to claim 10, further comprising a projecting region of the first conductivity type projecting from an upper surface of said first layer into said second layer.

12. The solid state image pickup device according to claim 10, wherein the charge storage region of the non-volatile memory element has a floating gate.

13. The solid state image pickup device according to claim 10, wherein the charge storage region of the non-volatile memory element has an interface between a silicon nitride film and a silicon oxide film.

14. A driving method for a solid state image pickup device, comprising the steps of:

(a) applying light to photodiodes distributed in a matrix layout and accumulating charges representative of image information, said photodiodes being formed in a second layer having a second conductivity type and being formed on a first layer of a semiconductor substrate, said first layer having a first conductivity type opposite to said second conductivity type, each of said photodiodes including a first region of said first conductivity type formed in said second layer, the first region being electrically floating, said solid state image pickup device having a gate structure including a control gate and a charge storage region, and formed on the second layer adjacent said first region, said charge storage region being electrically isolated from said first region, a drain region of said first conductivity type formed in the second layer adjacent to the gate structure on a side opposite to said first region, a first wiring connected to said drain region, a second wiring connected to said first layer, and a light shielding film formed above said semiconductor substrate and having apertures respectively above the first regions of said photodiodes;

(b) applying a first write control voltage to said control gate for tunneling and injecting at least a portion of charges stored in said first region representative of the image information into the charge storage region as signal charges; and (c) applying read control voltages to the drain region through said first wiring and to the control gate to detect a threshold voltage corresponding to an amount of the signal charges injected at said step (b) into the charge storage region.

15. The driving method for a solid state image pickup device according to claim 14, further comprising a step of, before said step (c):

(d) applying second write control voltages to the control gate and to the drain region through said first wiring and injecting as hot carriers at least a portion of the charges stored in the first region representative of the image information into the charge storage region as signal charges.

16. The driving method for a solid state image pickup device according to claim 14, wherein said step (c) includes a sub-step of:

(e) applying a bias voltage to an insulated gate type transistor formed adjacent to another portion of each of the first regions to turn on the transistor and supply a current to the first region.

17. The driving method for a solid state image pickup device according to claim 14, wherein said step (c) includes a sub-step of:

(f) applying a forward bias voltage to the first layer through said second wiring to supply a current to the first region.

18. The driving method for a solid state image pickup device according to claim 14, wherein said step (c) includes a sub-step of:

(g) applying a forward bias voltage, through said second wiring, to a projection region of the first conductivity type formed projecting from an upper surface of the first layer into the second layer to supply a current to the first region.

19. The driving method for a solid state image pickup device according to claim 14, further comprising a step of, before said step (a):

(h) applying a reverse bias voltage to the first layer through said second wiring to drain charges accumulated beforehand in the first regions to the first layer.

20. A solid state image pickup device comprising:

a semiconductor substrate having a first layer of a first conductivity type;

a second layer of a second conductivity type opposite to the first conductivity type, said second layer being formed on the first layer, in said semiconductor substrate;

a first region of the first conductivity type formed in said second layer and constituting a photodiode with said second layer, the first region being electrically floating and capable of storing charge carriers;

a first gate structure including a charge storage region and a control gate, said first gate structure being formed on a surface of said semiconductor substrate adjacent to a portion of said first region, and said charge storage region being isolated from said first region;

a second region of the first conductivity type formed in said second layer adjacent to said first gate structure on a side opposite to said first region, and constituting a non-volatile memory element with said first region and said first gate structure;

a first wiring connected to said second region for applying a voltage to said second region;

a light shielding film formed above said first gate structure and having an aperture above said first region;

a control circuit for applying a first write voltage to the control gate of said first gate structure, the first write voltage being a write voltage for tunneling and injecting charges accumulated in said first region into the charge storage region; and a second wiring connected to said first layer for applying a reset voltage from a voltage source to extinguish a potential barrier in the second layer and clear charges accumulated in the first region.

21. A solid state image pickup device comprising:

a semiconductor substrate having a first layer of a first conductivity type;

a second layer of a second conductivity type opposite to the first conductivity type, said second layer being formed on the first layer, in said semiconductor substrate;

a first region of the first conductivity type formed in said second layer and constituting a photodiode with said second layer, the first region being electrically floating and capable of storing charge carriers;

a first gate structure including a charge storage region and a control gate, said first gate structure being formed on a surface of said semiconductor substrate adjacent to a portion of said first region, and said charge storage region being isolated from said first region;

a second region of the first conductivity type formed in said second layer adjacent to said first gate structure on a side opposite to said first region, and constituting a non-volatile memory element with said first region and said first gate structure;

a first wiring connected to said second region for applying a voltage to said second region;

a light shielding film formed above said first gate structure and having an aperture above said first region;

a control circuit for applying a first write voltage to the control gate of said first gate structure, the first write voltage being a write voltage for tunneling and injecting charges accumulated in said first region into the charge storage region; and a fifth region of the second conductivity type, formed in a surface portion of said first region.

22. The solid state image pickup device according to claim 6, further comprising a second wiring connected to said first layer for applying a reset voltage from a voltage source to extinguish a potential barrier in the second layer and clear charges accumulated in the first region.

23. The solid state image pickup device according to claim 6, further comprising a fifth-region of the second conductivity type, formed in a surface portion of said first region.

24. The solid state image pickup device according to claim 10, further comprising a second wiring connected to said first layer for applying a reset voltage from a voltage source to extinguish a potential barrier in the second layer and clear charges accumulated in the first region.

25. The solid state image pickup device according to claim 10, further comprising a fifth region of the second conductivity type, formed in a surface portion of said first region.

26. The solid state image pickup device according to claim 2, wherein the charge storage region of the non-volatile memory element has a floating gate.

27. The solid state image pickup device according to claim 2, wherein the charge storage region of the non-volatile memory element has an interface between a silicon nitride film and a silicon oxide film.

28. The solid state image pickup device according to claim 3, wherein the charge storage region of the non-volatile memory element has a floating gate.

29. The solid state image pickup device according to claim 3, wherein the charge storage region of the non-volatile memory element has an interface between a silicon nitride film and a silicon oxide film.

* * * * *